(12) United States Patent
Huang

(10) Patent No.: US 6,735,079 B2
(45) Date of Patent: May 11, 2004

(54) HEAT DISSIPATION APPARATUS

(75) Inventor: I-Huei Huang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 10/387,924

(22) Filed: Mar. 13, 2003

(65) Prior Publication Data

US 2004/0057209 A1 Mar. 25, 2004

(30) Foreign Application Priority Data

Sep. 24, 2002 (TW) ....................................... 91121848 A

(51) Int. Cl.[7] ................................................. H05K 7/20
(52) U.S. Cl. ...................... 361/695; 165/80.3; 165/121; 165/126; 361/693; 454/184; 454/334
(58) Field of Search ........................ 165/80.3, 121–122, 165/126; 361/687–703; 454/184, 334

(56) References Cited

U.S. PATENT DOCUMENTS 5,684,674 A * 11/1997 Yin .............................. 361/695
6,554,697 B1 * 4/2003 Koplin ........................ 454/184
6,597,571 B2 * 7/2003 Kubota et al. ............... 361/695

FOREIGN PATENT DOCUMENTS

TW            435928            5/2001

* cited by examiner

Primary Examiner—Gregory D Thompson
(74) Attorney, Agent, or Firm—Snell & Wilmer L.L.P.

(57) ABSTRACT

The present invention is related to a venting apparatus for a computer. The apparatus includes a chassis plate and a venting plate. The chassis plate has a first hole and a second hole. The venting plate has a plurality of venting apertures. The venting plate is selectively disposed over the first hole and the second hole.

21 Claims, 6 Drawing Sheets

HEAT DISSIPATION APPARATUS

CROSS REFERENCE TO RELATED APPLICATIONS

This Application claims priority to Taiwan Patent Application No. 091121848 entitled "Heat Dissipation Apparatus", filed Sep. 24, 2002.

FIELD OF INVENTION

The present invention relates to a computer heat dissipation apparatus, and more particularly, to a heat dissipation apparatus for a computer chassis.

BACKGROUND OF THE INVENTION

Computer chassis are used to prevent components in computers from the dust and moisture damage. Further, the computer chassis reserve venting apertures on the back plate for the ventilation purpose. In addition; the computer chassis reserve fixed venting apertures on the side plate to assist the fluid flow. Without using any active heat dissipation device, i.e. fans, the suitable apertures may lower temperatures of hard discs and AGP card components.

Therefore, current computer chassis are designed to have many venting apertures on the side plates. Further, some computer chassis have venting apertures over all side plates. However, this results in the de-concentration of fluid flows and deteriorates cooling effect.

As shown in FIG. 1, the venting apertures 103 of traditional computer chassis 100 are located on the rear area of the side plate 101. The venting apertures 103 may increase the air flow to cool the peripheral component interconnect (PCI) interface components 105. The venting apertures 203 of another traditional computer chassis 200 are located on the front area of the side plate 201 as shown in FIG. 2. The venting apertures 203 may increase the air flow to cool the hard disc.

Different main board designs have different inner components configurations. Therefore, the venting aperture locations need to cope with the inner components configurations. To meet demands of different venting aperture locations, the designer needs to design suitable computer chassis. The requirements bring inconvenience to the designers.

SUMMARY OF THE INVENTION

In order to solve the problem mentioned above, the present invention provides a venting apparatus for a computer. Users may change the locations or shapes of the venting apertures on a chassis plate to match various needs.

The venting apparatus for a computer includes a chassis plate and a venting plate. The chassis plate has a first hole and a second hole. The venting plate has a plurality of venting apertures. The venting plate is selectively disposed over first hole and second hole. The apparatus further includes a dummy plate. The dummy plate is disposed over the second hole when venting plate is disposed over the first hole. The dummy plate is disposed over the first hole when venting plate is disposed over the second hole.

In addition, the present invention provides another venting apparatus for computer. The apparatus includes a venting plate and a chassis plate. The venting plate has a plurality of venting apertures. The chassis plate has a hole, a first guide, and a second guide. The hole defines a first position and a second position. The venting plate slidably engages with the first guide and the second guide, and is selectively disposed over a first position and a second position.

The venting apparatus further includes a dummy plate. The dummy plate slidingly engages with the first guide and the second guide. The dummy plate is disposed over the second position when the venting plate is disposed over the first position. The dummy plate is disposed over the first position when the venting plate is disposed over the second position.

DETAILED DESCRIPTION

The present invention provides a venting apparatus. The apparatus uses a chassis plate, a venting plate, and a dummy plate to vent heats. The chassis plate has a first hole and a second hole. The venting plate has a plurality of venting apertures.

These venting plate may be selectively disposed over the first hole and the second hole. The apparatus further includes a dummy plate. The dummy plate has no venting apertures. The dummy plate is disposed over the second hole of the chassis plate when the venting plate is disposed over the first hole. The dummy plate is disposed over the first hole of the chassis plate when the venting plate is disposed over the second hole.

Figure 1:
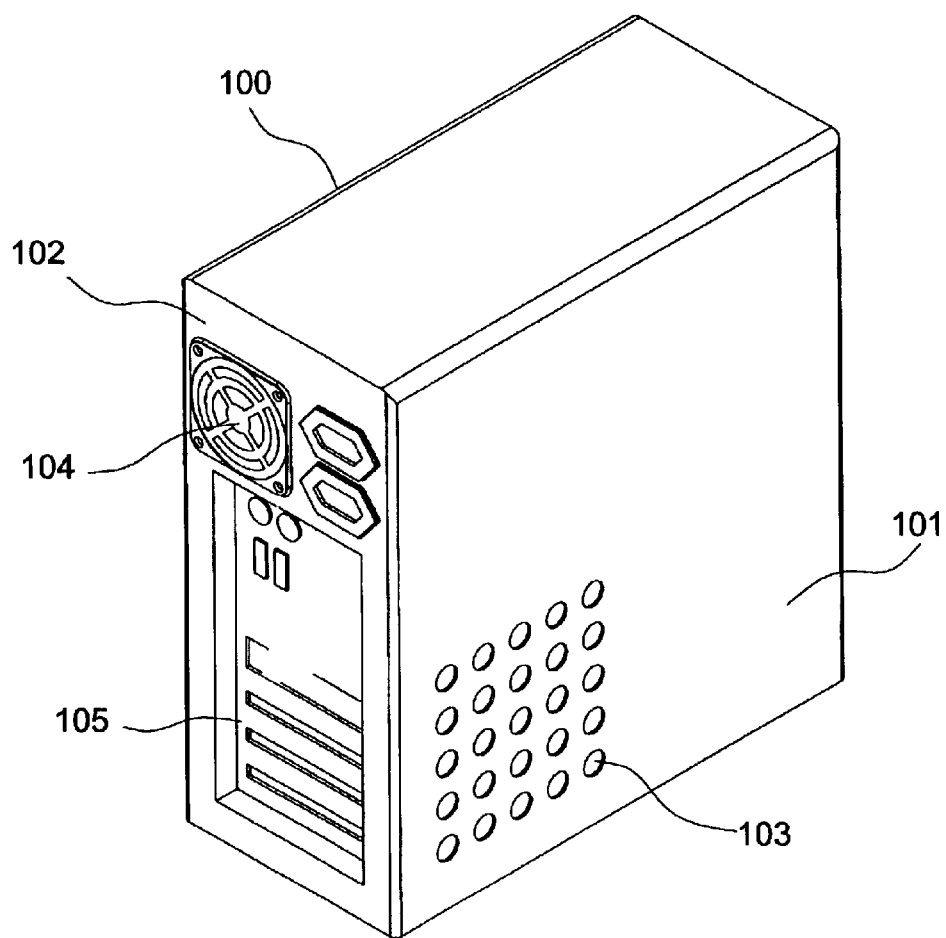
FIG. 1 shows a venting apparatus of prior art.
Figure 2:
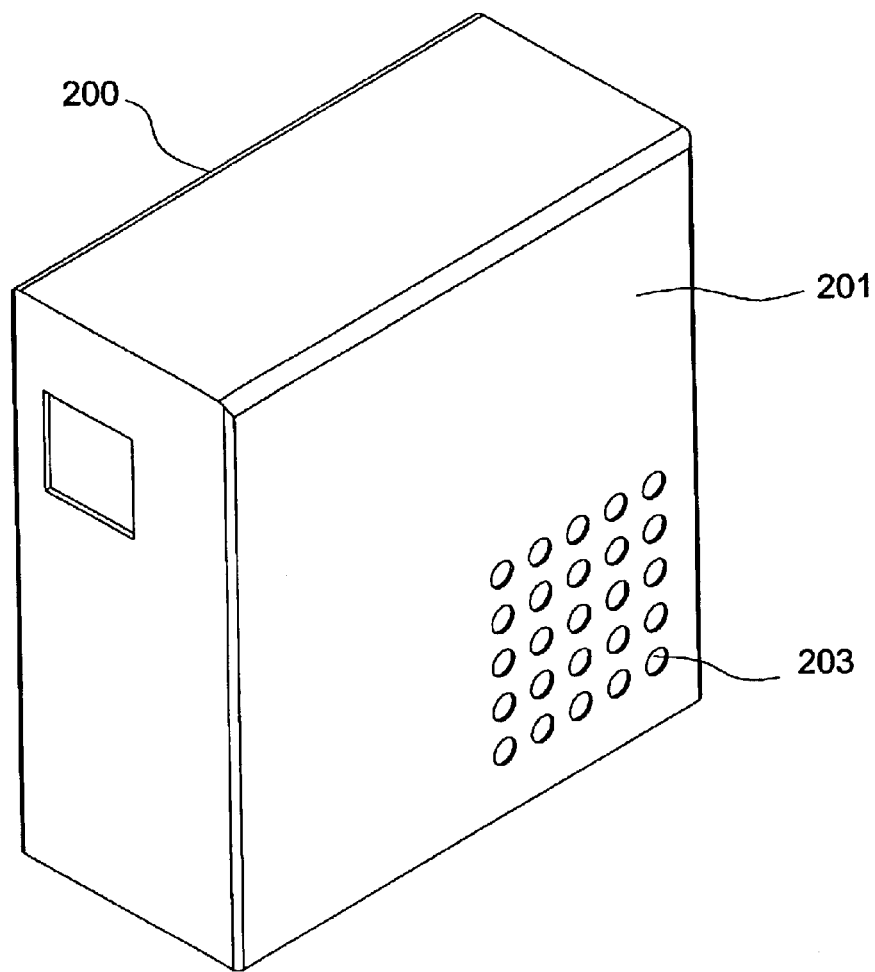
FIG. 2 shows another venting apparatus of prior art.
Figure 3:
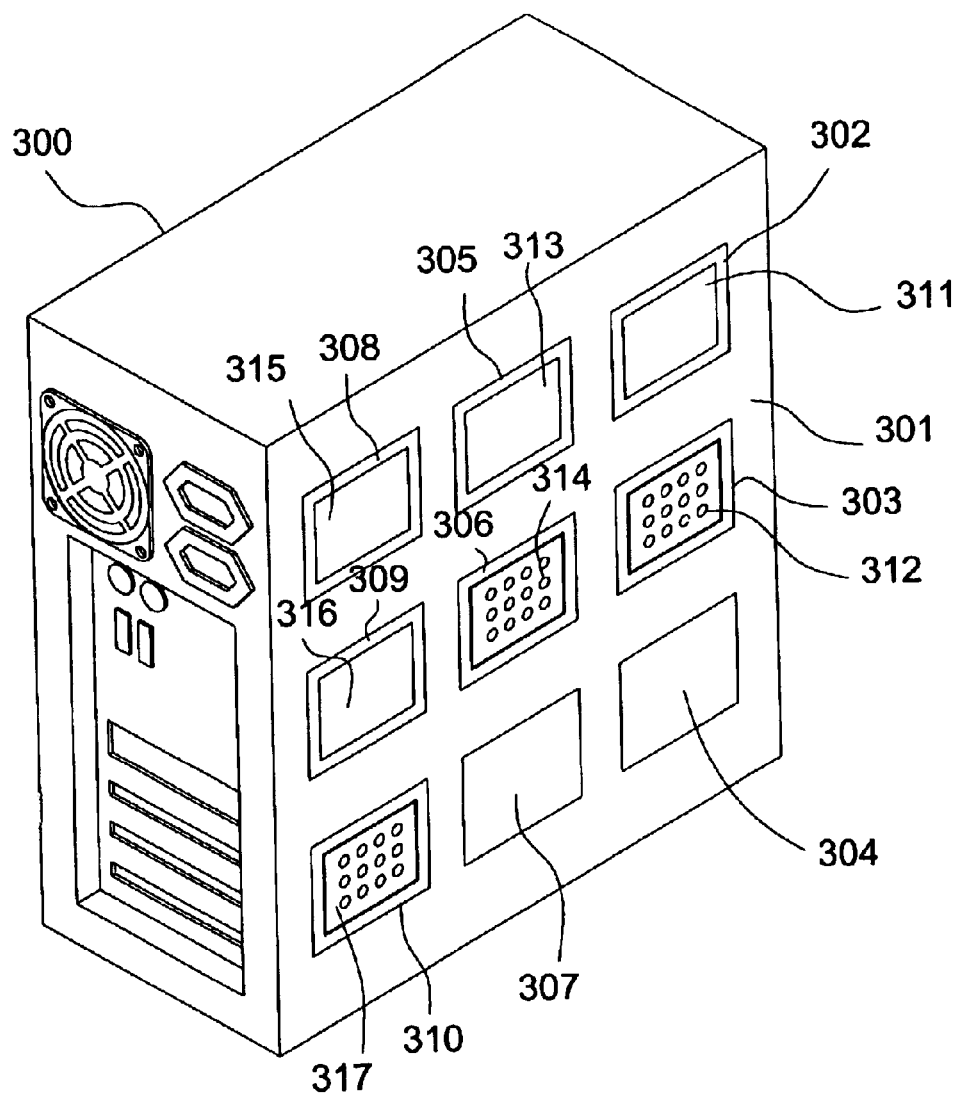
FIG. 3 shows the first exemplary embodiment of the present invention.

FIG. 3 shows the first embodiment of the present invention. The computer chassis 300 has chassis plate 301. The chassis plate 301 has 9 holes 302, 303, 304, 305, 306, 307, 308, 309, and 310. Dummy plates 311, 313, 315 and 316 are respectively disposed over the holes 302, 305, 304, and 309. Venting plates 312, 314, and 317 are respectively disposed over the holes 303, 306, and 310. A venting plate may be selectively disposed over one of the holes of the chassis plate to cool the components in the corresponding area while a dummy plate is disposed over the other holes. The hole number of the chassis plate may change with the needs. The venting plate number may also change with the needs as well as the dummy plate number. It should be noted that disposing venting plates over all holes of the chassis plate or disposing dummy plates over all holes of the chassis plate deteriorates cooling effect.

The present invention provides another venting apparatus. The apparatus has chassis plate, first guide, second guide, and venting plate. The chassis has a hole. The hole defines a first position and a second position. The venting plate has a plurality of venting apertures for venting heats.

The venting plate engages with the first guide and the second guide, and is selectively disposed over the first position and the second position. Further, the, present invention includes a dummy plate. The dummy plate engages with the first guide and the second guide. The dummy plate is disposed over the second position when the venting plate is disposed over the first position. The dummy plate is disposed over the first position when the venting plate is disposed over the second position.

Figure 4:
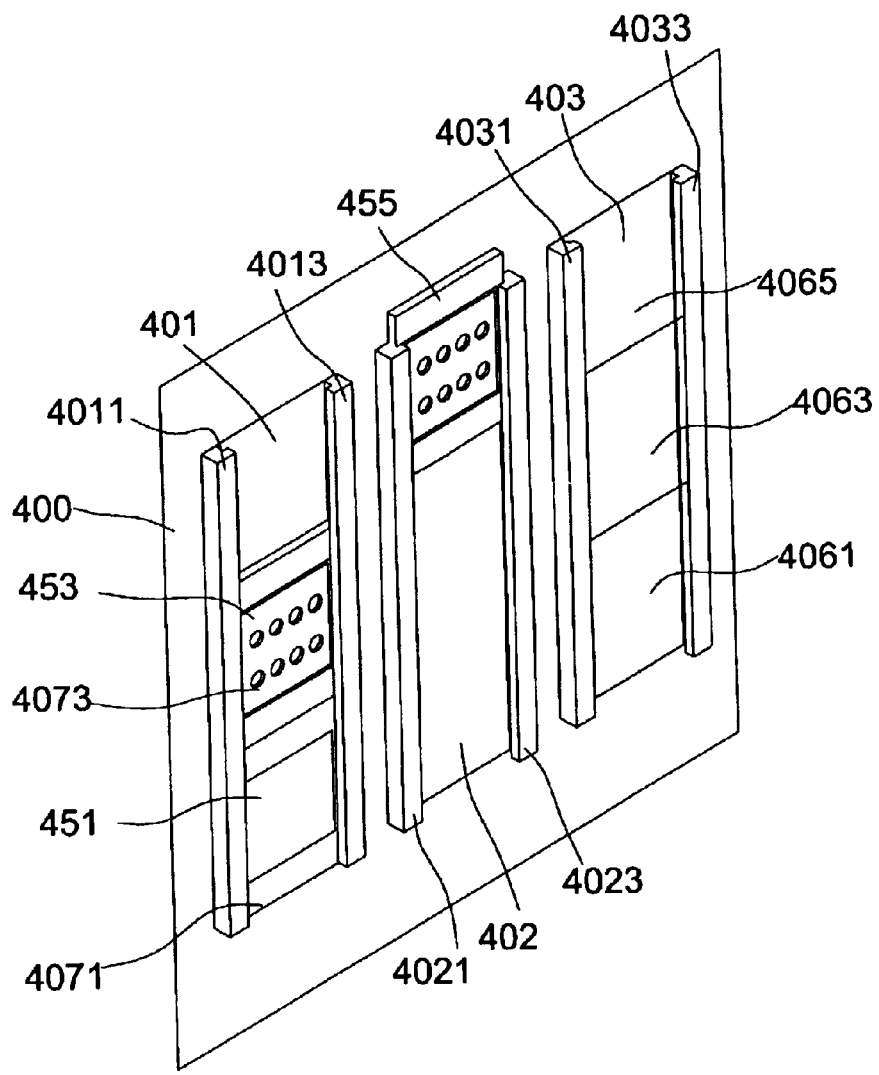
FIG. 4 shows the second exemplary embodiment of the present invention.

FIG. 4 shows the second embodiment of the present invention. The embodiment has a chassis plate 400. The chassis plate 400 has 3 holes 401, 402, and 403. The hole 401 has guides 4011, and 4013. The hole 402 has guides 4021, and 4023. The hole 403 has guides 4031, and 4033. As shown in FIG. 4, each hole defines 3 positions. For example, the hole 403 defines a first position 4061, a second position 4063, and a third position 4065. The venting plates and the dummy plates may selectively engage with the guides.

In the embodiment, dummy plate 451 engages with guide 4011 and 4013, and is. disposed over the first position 4071. Venting plate 453 engages with guide 4011 and 4013, and is disposed over the second position 4073 to cool the computer components in the corresponding area. Venting plate 455 engages with guide 4031 and 4023 of the hole 402. It should be noted that disposing venting plates over all holes of the chassis plate or disposing dummy plates over all positions of the chassis plate deteriorates cooling effect.

Figure 5:
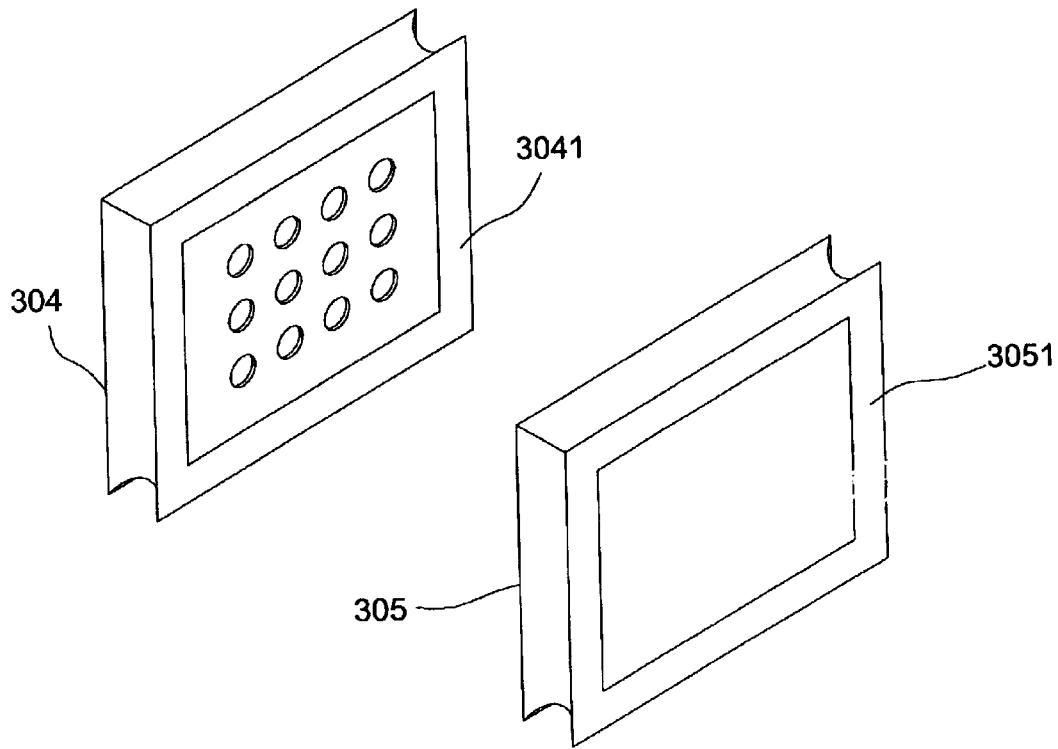
FIG. 5 shows the structure of a venting plate.

As shown in FIG. 5, the venting plate 304 further has an elastomer 3041 on edges. The venting plate 304 uses the elastomer 3041 to connect with the edge of the hole. The elastomer 3041 is a conductive rubber preventing the computer form electromagnetic interference. Similarly, the dummy plate 305 also has an elastomer 3051 on edges. The dummy plate 305 also uses the elastomer 3051 to connect with the edge of the hole. In addition, the location of venting apertures on the venting plate may change with the needs. The venting plate and dummy plate may have various colors.

Figure 6:
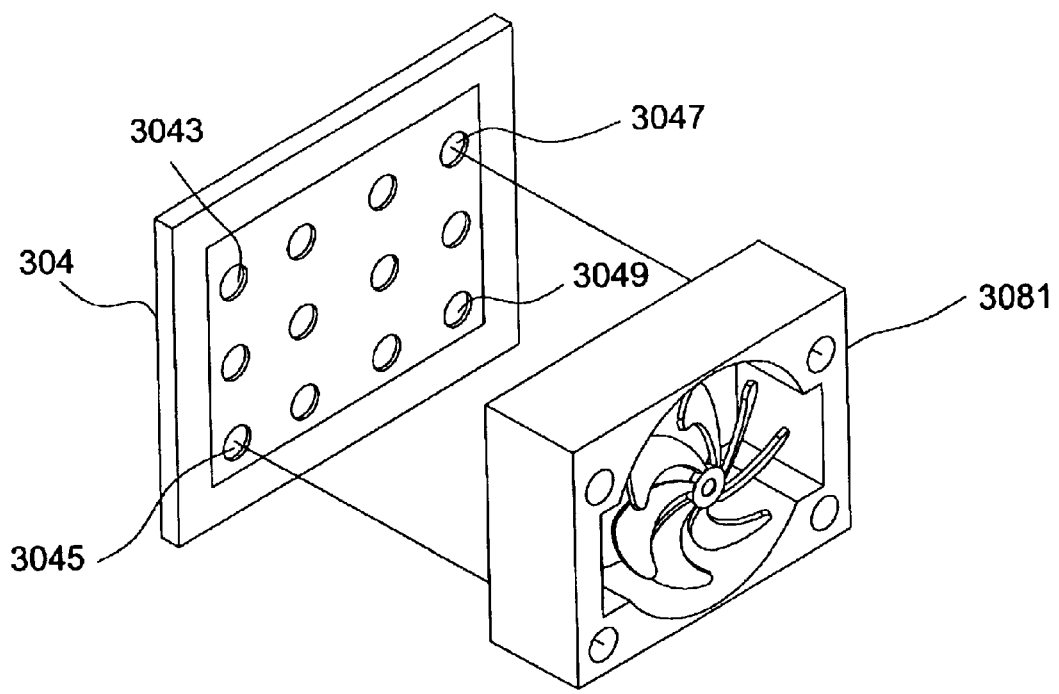
FIG. 6 shows the assembly of a venting plate and a fan.
Figure 6:
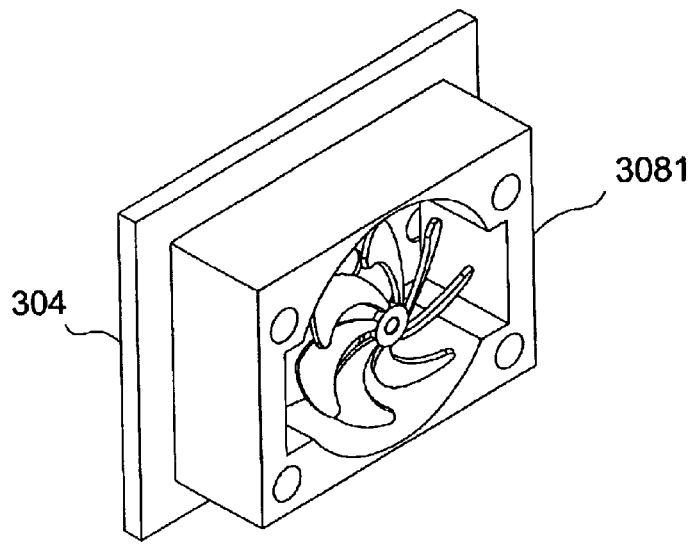

A fan 3081 is selectively connected with the venting plate 304 of the present invention as shown in FIG. 6. The fan 3081 provides active fluid flow to enhance the cooling effect. The fan 304 is connected with the venting plate 304 by using the venting apertures 3043, 3045, 3047, and 3049 on the edges of the venting plate 304. The venting plate 304 connected with fan 3081 may dispose over any holes on the chassis or engage with any guides on the chassis.

While this invention has been described with reference to an illustrative embodiment, this embodiment is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as falling within the true scope of the invention.

I claim:

1. A venting apparatus for a computer, comprising:
   a chassis plate having a first hole and a second hole;
   a venting plate having a plurality of venting apertures; and
   an elastomer connected with edges of said venting plate;
   wherein said venting plate is selectively disposed over said first hole and said second hole.

2. The apparatus of claim 1, wherein said elastomer is a conductive rubber.

3. The apparatus of claim 1, wherein a fan is selectively connected with said venting plate.

4. The apparatus of claim 1, further comprising a dummy plate, wherein said dummy plate is disposed over said second hole when said venting plate is disposed over said first hole, and said dummy plate is disposed over first hole when said venting plate is disposed over said second hole.

5. The apparatus of claim 4, wherein the elastomer is connected with edges of said dummy plate.

6. The apparatus of claim 5, wherein said elastomer is a conductive rubber.

7. A venting apparatus for a computer, comprising:
   a chassis plate having a first hole and a second hole;
   a dummy plate;
   a venting plate having a plurality of venting apertures;
   a first elastomer being connected with edges of said venting plate; and
   a second elastomer being connected with edges of said dummy plate;
   wherein said dummy plate is disposed over said second hole when said venting plate is disposed over said first hole, and said dummy plate is disposed over first hole when said venting plate is disposed over said second hole.

8. The apparatus of claim 7, wherein said first elastomer and said second elastomer are conductive rubber.

9. A venting apparatus for a computer, comprising:
   a venting plate having a plurality of venting apertures; and
   a chassis plate having a first guide, a second guide, and a hole, said hole defining a first position and a second position;
   wherein said venting plate slidably engages with said first guide and said second guide, and is selectively disposed over said first position and said second position.

10. The apparatus of claim 9, further including an elastomer connected with edges of said vending plate.

11. The apparatus of claim 10, wherein said elastomer is a conductive rubber.

12. The apparatus of claim 9, wherein a fan is selectively connected with said venting plate.

13. The apparatus of claim 9, further including a dummy plate, said dummy plate slidably engaging with said first guide and said second guide, said dummy plate being disposed over said second position when said venting plate is disposed over said first position, and said dummy plate being disposed over said first position when said venting plate is disposed over said second position.

14. The apparatus of claim 13, further including an elastomer connected with edges of said dummy plate.

15. The apparatus of claim 14, wherein said elastomer is a conductive rubber.

16. A venting apparatus for computer, comprising:
   a venting plate having a plurality of venting apertures;
   a dummy plate; and
   a chassis plate having a first guide, a second guide, and a hole, said hole defining a first position and a second position;
   wherein said venting plate and said dummy plate slidably engages with said first guide and said second guide, said dummy plate being disposed over said second position when said venting plate is disposed over said first position, and said dummy plate being disposed over said first position when said venting plate is disposed over said second position.

17. The apparatus of claim 16, further including a first elastomer and a second elastomer, said first elastomer being connected with edges of said venting plate, said second elastomer being connected with edges of said dummy plate.

18. The apparatus of claim 17, wherein said first elastomer and said second elastomer are conductive rubber.

19. A heat dissipation apparatus comprising:
   a chassis plate having a first opening;
   a venting plate having a plurality of apertures for heat dissipation, said venting plate detachably engaging with said chassis plate and being received in said first opening; and
   an elastomer connected with edges of said venting plate.

20. The heat dissipation apparatus of claim 19, further comprising:
   a second opening disposed on said chassis plate;
   a dummy plate detachably engaging with said chassis plate and being received in said second opening, wherein said venting plate and said dummy plate are exchangeable with respect to said first opening and said second opening.

21. The heat dissipation apparatus of claim 19, further comprising:
   a dummy plate detachably engaging with said chassis plate and being received in said first opening, wherein said venting plate being received in a first position of said first opening and said dummy plate being received in a second position of said first opening.

* * * * *